United States Patent [19]
Ohsawa

[11] Patent Number: 4,906,914
[45] Date of Patent: Mar. 6, 1990

[54] INTERMEDIATE POTENTIAL GENERATION CIRCUIT FOR GENERATING A POTENTIAL INTERMEDIATE BETWEEN A POWER SOURCE POTENTIAL AND GROUND POTENTIAL

[75] Inventor: Takashi Ohsawa, Kanagawa, Japan

[73] Assignee: Kabushiki Kaisha Toshiba, Kawasaki, Japan

[21] Appl. No.: 285,755

[22] Filed: Dec. 16, 1988

[30] Foreign Application Priority Data

Dec. 18, 1987 [JP] Japan ................. 62-320423

[51] Int. Cl.⁴ .................................. G05F 3/24
[52] U.S. Cl. ........................ 323/314; 307/296.6
[58] Field of Search ............ 323/312, 313, 314, 315, 323/316; 307/296.1, 296.2, 296.5, 296.6, 296.8

[56] References Cited

U.S. PATENT DOCUMENTS

| | | | |
|---|---|---|---|
| 4,663,584 | 5/1987 | Okada ................................ | 323/313 |
| 4,788,455 | 11/1988 | Mori et al. ...................... | 323/314 X |
| 4,814,686 | 3/1989 | Watanabe ....................... | 323/312 X |
| 4,833,342 | 5/1989 | Kiryu et al. ..................... | 307/296.1 |
| 4,837,459 | 6/1989 | Kukowski et al. .............. | 307/296.8 |

FOREIGN PATENT DOCUMENTS

0157315 9/1982 Japan .................................. 323/312

Primary Examiner—Patrick R. Salce
Assistant Examiner—Kristine Peckman
Attorney, Agent, or Firm—Oblon, Spivak, McClelland, Maier & Neustadt

[57] ABSTRACT

An intermediate potential generation circuit for outputting an intermediate potential intermediate between a power source potential and ground potential, including a reference potential generator circuit for generating first and second reference potentials, and a comparator circuit for comparing the intermediate output with the first and second reference potentials. When the intermediate output potential is lower than the first reference potential, the comparator circuit outputs a first control signal at the level of the power source potential to a first MOS transistor supplied with the power source potential to raise the intermediate output potential level. When the output intermediate potential is higher than the second reference potential, the comparator circuit outputs a second control signal at the level of the power source potential to a second MOS transistor supplied with ground potential to lower the intermediate output potential.

11 Claims, 5 Drawing Sheets

INTERMEDIATE POTENTIAL GENERATION CIRCUIT FOR GENERATING A POTENTIAL INTERMEDIATE BETWEEN A POWER SOURCE POTENTIAL AND GROUND POTENTIAL

BACKGROUND OF THE INVENTION

1. Field of the Invention

This invention concerns an intermediate potential generation circuit for generating a potential intermediate between a power source potential Vcc and ground potential in a semiconductor chip, such as a LSI chip. More particularly, this invention concerns an intermediate potential generation circuit which has a large current driving capacity and a low power consumption.

2. Description of the Background

Figure 1:
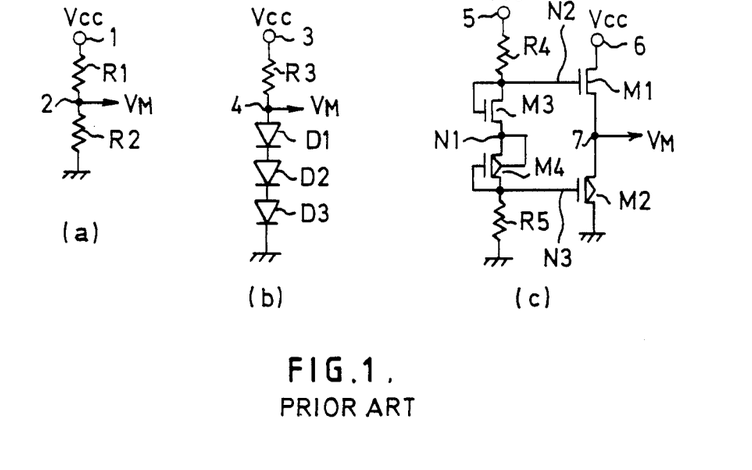
FIGS. 1(a) to 1(c) are circuit diagrams of convention intermediate potential generation circuits.

Conventionally, intermediate potential circuits as shown in FIGS. 1 (a) to (c) are used to generate an intermediate potential within a LSI chip.

In FIG. 1 (a), an intermediate potential VM is achieved at node 2 by dividing a power source potential Vcc supplied to a terminal 1 by resistors R1 and R2.

In FIG. 1 (b), an intermediate potential VM is achieved at node 4 by dividing a power source potential Vcc supplied to a terminal 3 by a resistor R3 and a series connection of diodes D1 to D3.

In FIG. 1 (c), the intermediate voltage VM is maintained within a range determined by the reference potentials at nodes N2 and N3. Namely, the potential VN2 at node N2 is higher than the potential VN1 at the node N1 by the threshold voltage VTN3 of an N-channel MOS transistor M3. Thus, the potential VN2 is expressed as follows.

$$VN2 = VN1 + VTN3 \tag{1}$$

On the other hand, the potential VN3 at the node N3 is lower than the potential VN1 by the absolute value VTP4 of the threshold voltage of a P-channel MOS transistor M4. Thus, it is expressed as follows.

$$VN3 = VN1 - VTP4 \tag{2}$$

In the case where the intermediate potential VM is lower than the first reference potential VN2 by the threshold voltage VTN1 of the N-channel MOS transistor M1, the MOS transistor M1 changes to a conductive state, and the intermediate potential VM is raised.

When the intermediate potential VM is higher than the second reference potential VN3 by the absolute value VTP2 of the threshold voltage of a P-channel MOS transistor M2, the MOS transistor M2 becomes conductive to lower the intermediate potential VM. In this way, the intermediate potential VM is maintained within a range expressed as follows:

$$\{VN1 - (VTN1 - VTN3)\} < V\text{-}M < \{VN1 + (VTP2 - VTP4)\} \tag{4}$$

Figure 2:
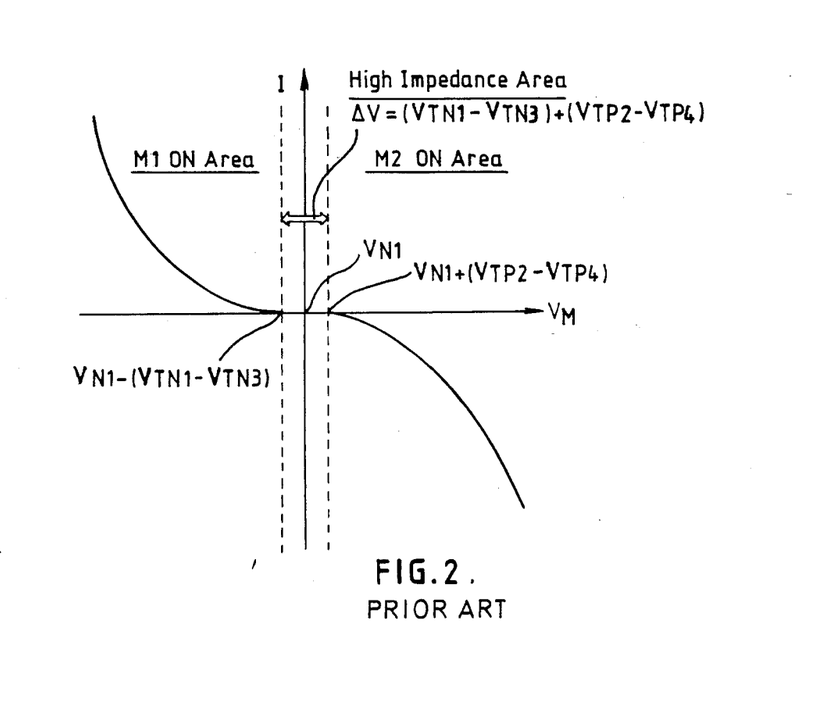
FIG. 2 is a characteristic curve showing the characteristic of the conventional circuit of FIG. 1(c)

Thus, by setting the threshold voltage VTN1 larger than VTN3, and by setting VTN2 larger then VTP4, the intermediate potential VM is maintained within a range ΔV as shown in FIG. 2. The range ΔV is expressed as follows.

$$\Delta V = \Delta VTN + \Delta VTP \tag{5}$$

wherein ΔVTN (VTN1−VTN3), and ΔVTP is (VTP2−VTP4).

In this way, the intermediate potential VM is maintained within a predetermined allowed range ΔV. When the intermediate potential VM is within the range ΔV, no through current flows between the terminal 6 and ground since both the MOS transistors M1 and M2 are nonconductive, and in the high impedance state. Thus, it is possible to employ MOS transistors of large dimension to increase the current driving capacity.

The constructions of FIGS. 1 (a) and (b) are simple. However, with these constructions it is impossible both to reduce power consumption and increase the driving capacity at the same time. Namely, in the case where a large capacitor is connected to the output terminals 2 and 4, a large current driving capacity is required to bring back the intermediate potential VM to the predetermined value determined by the resistance value, from the shifted potential level. When the resistance values of the resistors R1, R2 and R3 are reduced to increase the current driving capacity so as to obtain rapid recovery of the intermediate potential VM, the current which flows through the resistors increases, and the power consumption is increased.

In the prior are of FIG. 1 (c), by setting the resistance value of the resistors R4 and R5 sufficiently high, it is possible to reduce the power consumption. Furthermore, by increasing the dimension of the transistors M1 and M2, large current driving capacity is achieved.

However, the gate to source voltages of the MOS transistors M1 and M2 are difference voltages between the intermediate potential VM and the first and the second reference potentials VN2 and VN3. Therefore, in the condition where the intermediate potential VM is slightly out of the allowed range ΔV, the transistors M1 and M2 operate in a saturation condition. Thus, the current driving capacities of the transistors M1 and M2 are not so large, as shown in FIG. 2, since the respective gate to source voltages supplied to the transistors are relatively small. Therefore, even if MOS transistors having large dimension are used for the MOS transistors M1 and M2 to increase the driving capacity, these transistors are not used effectively to increase the current driving capacity. Thus, the circuit of FIG. 1 (c) is inadequate in the case where fast response or rapid recovery is required.

SUMMARY OF THE INVENTION

Accordingly, an object of this invention is to provide a new and improved intermediate potential generation circuit of low power consumption yet having increased current driving capacity.

The above object, as well as other objects, is achieved by providing a novel intermediate potential generation circuit for outputting an intermediate potential responsive to power source potential, including: reference potential generating means for generating first and second reference potentials responsive to the power source potential, where the first reference potential is lower than the second reference potential; comparing means responsive to the first reference potential, the second reference potential and the intermediate potential for producing a first control signal when the intermediate potential is lower than the first reference potential, and for producing a second control signal when the intermediate potential is higher than the second reference potential; first circuit means responsive to the first control signal for raising the intermediate potential; and second circuit means responsive to the second control signal for lowering the intermediate potential.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 3:
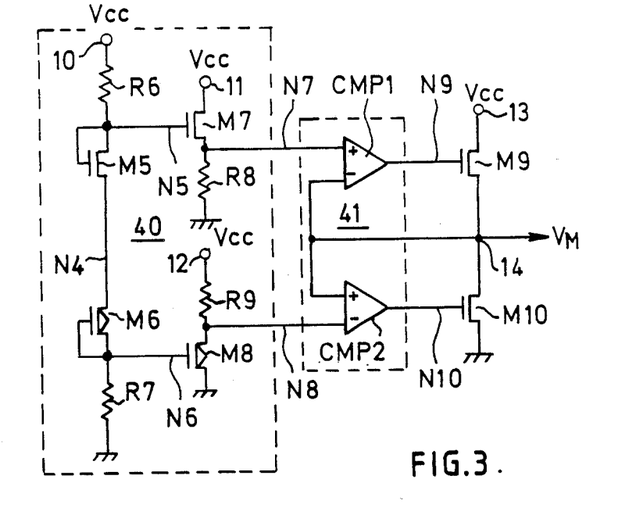
FIG. 3 is a circuit diagram of a preferred embodiment of the present invention.

Referring now to the drawings, wherein like reference numerals designate identical or corresponding parts throughout the several views, and more particularly to FIG. 3 thereof, there is illustrated a preferred embodiment of this invention. As shown in FIG. 3, there is provided a reference potential generating circuit 40 for generating first and second reference potentials responsive to a power source potential. The generating circuit 40 includes resistors R6, R7, R8, R9, P-channel MOS transistors M6, M8 and N-channel MOS transistors M5 and M7. The resistor R6, the MOS transistors M5 and M6 and the resistor R7 are serially connected between a terminal 10 supplied with a power source potential Vcc and ground. The gate electrode and the drain electrode of the MOS transistor M5 are connected in common. The gate electrode and the drain electrode of the MOS transistor M6 are connected in common.

The MOS transistor M7 and the resistor R8 are connected in series between a terminal 11 supplied with the power source potential Vcc and ground. The connection between the resistor R8 and the source electrode of the MOS transistor M7 forms a node N7. The gate electrode of the MOS transistor M7 is connected to a node N5.

The resistor R9 and the MOS transistor M8 are connected in series between a terminal 12 supplied with the power source potential Vcc and ground. The connection between the resistor R9 and the source electrode of the MOS transistor M8 forms a node N8. The gate electrode of the transistor M8 is connected to the node N6. The threshold voltage of the MOS transistor M5 is made smaller than that of the MOS transistor M7, and the absolute value of the threshold voltage of the MOS transistor M6 is made smaller than that of the MOS transistor M8, by taking the following measures.

To make the threshold voltage of the MOS transistor M5 smaller than that of the MOS transistor M7, the following techniques are used, for example;

(i) a short-channel effect is used by shortening the channel length of the MOS transistor M5 relative to that of the MOS transistor M7;

(ii) a narrow-channel effect is used by narrowing the channel width of the MOS transistor M7 relative to that of the transistor M5;

(iii) a substrate bias effect only to the MOS transistor M7 is effected, by setting the potential of the substrate of the MOS transistor M5 equal to the potential at node N4, since usually Vbb (about −2.0 volt) is supplied to the substrate of the MOS transistor. More particularly, the MOS transistor M5 is formed within a specific P-type well (not shown), and biasing the well is braced with the potential at the node N4;

(iv) the dose amount of impurities for the respective channel regions of the MOS transistors M5 and M7 is changed.

In the same way, the absolute value of the threshold voltage of the MOS transistor M8 is made larger than that of the MOS transistor M6 by using the following techniques, for example:

(i) a short-channel effect is used by shortening the channel length of the MOS transistor M6 relative to that of the MOS transistor M8;

(ii) a narrow-channel effect is used by narrowing the channel width of the MOS transistor M8 relative to that of the transistor M6;

(iii) the substrate potential of the MOS transistor M6 is lowered relative to that of the MOS transistor M8 (bias potential of the MOS transistor M8 is Vcc), by applying the potential at the node N4 to an N-type well (not shown) wherein the MOS transistor M6 is formed;

(iv) the dose amount of impurities of the respective channel regions of the MOS transistors M6 and M8 is changed.

By this construction, the reference potential generating means 40 generates first and second reference potentials at nodes N7 and N8.

Namely, the potential VN5 at node N5 is expressed as follows.

$$VN5 = VN4 + VTN5 \tag{6}$$

wherein VN4 is the potential at node N4, and VTN5 is the threshold voltage of the N-channel MOS transistor M5.

The potential at node N6 is lower than the potential VN4 at node N4 by the absolute value VTP6 of the threshold voltage of the P-channel MOS transistor M6. Thus, the potential VN6 at the node N6 is expressed as follows.

$$VN6 = VN4 - VTP6 \tag{7}$$

On the other hand, the potential VN7 at node N7 is lower than the potential VN5 by the threshold voltage of the N-channel MOS transistor M7. Thus, the potential VN7, namely the first reference potential, is expressed as follows.

$$VN7 = VN5 - VTN7 \tag{8}$$

In the same way, the potential VN8 at node N8 is higher than the potential VN6 by the absolute value VTP8 of the threshold voltage of the MOS transistor M8. Thus, the potential VN8, namely the second reference potential, is expressed as follows.

$$VN8 = VN6 + VTP8 \tag{9}$$

Substituting equations (6) and (7) into equations (8) and (9), respectively, the potentials VN7 and VN8 at nodes N7 and N8 are expressed as follows.

$$VN7 = VN4 - (VTN7 - VTN5) \quad (10)$$

$$VN8 = VN4 + (VTP8 - VTP6) \quad (11)$$

As the threshold voltages VTN7 and VTP8 are set larger than VTN5 and VTP6, respectively, the equations (10) and (11) can be rewritten as follows.

$$VN7 = VN4 - \Delta VTN \quad (12)$$

$$VN8 = VN4 + \Delta VTP \quad (13)$$

wherein $\Delta VTN$ is (VTN7−VTN5), and $\Delta VTP$ is (VTP8−VTP6).

Thus, the first reference potential VN7 can be set lower than the second reference potential VN8.

In the present invention, there is provided comparing means responsive to the first and the second reference potentials and output, namely the intermediate potential VM. In the preferred embodiment of the FIG. 3, the comparing means 41 includes first comparator CMP1 and second comparator CMP2. The non-inverting input terminal (+) of the first comparator CMP1 is connected to the node N7 and receives the first reference potential VN7. The inverting input terminal (−) of the second comparator CMP2 is connected to the node N8, and receives the second reference potential VN8. Both of the first and the second comparators CMP1 and CMP2 are biased with the power source potential Vcc and ground.

In the present invention, there is provided first circuit means responsive to the control signal of the comparing means 41. In the preferred embodiment of FIG. 3, the first circuit means is an N-channel MOS transistor M9. The gate electrode of the MOS transistor M9 is connected to the output of the first comparator CMP1, and the drain electrode thereof is connected to a terminal 13 supplied with the power source potential Vcc. The source electrode of the MOS transistor M9 is connected to an output terminal 14.

In the present invention, there is provided second circuit means responsive to the control signal of the comparing means 41. In the preferred embodiment of FIG. 3, the second circuit means is an N-channel MOS transistor M10. The gate electrode of the MOS transistor M10 is connected to the second comparator CMP2 and the source electrode thereof is connected to ground. The drain electrode of the transistor M10 is connected to the output terminal 14.

The inverting input terminal (−) of the comparator CMP1 is connected to the output terminal 14, and receives the output voltage, namely an intermediate voltage VM. On the other hand, the non-inverting input terminal (+) of the comparator CMP2 is connected to the output terminal 14, and receives the intermediate voltage VM.

The operation of the intermediate circuit of FIG. 3 is as follows.

When the intermediate potential VM is lower than the first reference potential VN7, the comparator circuit CMP1 outputs a potential which is equal to the power potential Vcc, as a control signal. Thus, the N-channel MOS transistor M9 changes to a conductive state. Thus, the output terminal 14 is charged, and the intermediate potential VM is raised. On the contrary, when the intermediate voltage VM exceeds the first reference potential VN7, the comparator CMP1 outputs a potential which is equal to ground level, namely 0 volt. Thus, the MOS transistor M9 changes to a non-conductive state.

On the other hand, when the intermediate potential VM is higher than the second reference potential VN8, the second comparator CMP2 outputs a potential which is equal to Vcc, and makes the N-channel MOS transistor M10 conductive. Thus, a discharging is performed to lower the intermediate potential VM at the output terminal 14. On the contrary, when the intermediate potential VM becomes lower than the second reference potential VN8, the second comparator CMP2 outputs a potential which is equal to the ground level, namely 0 volt. Thus, the MOS transistor M10 changes to a non-conductive state, and the discharge is stopped.

In this way, the intermediate potential VM is maintained within an allowed range expressed as follows.

$$VN7(=VN4-\Delta VTN) < VM < VN8(=VN4+\Delta VTP) \quad (14)$$

When equation (14) is satisfied, both of the transistors M9 and M10 are non-conductive, and no through current flows between the terminal 13 and ground. Furthermore, when the intermediate voltage VM is out of the condition stated in equation (14), the gate potential supplied by either comparator CMP1 or CMP2 is equal to the power source potential Vcc and is sufficiently high. Thus, the gate to source voltage of the MOS transistors M9 or M10, when in the conductive state, is sufficiently large. Therefore, the current driving capacity of the MOS transistors M9 and M10 is sufficiently high compared to that of the prior art in FIG. 1 (c). Therefore, the intermediate potential VM is pulled into the allowed range $\Delta V$ (=$\Delta VTN+\Delta VTP$) very rapidly, even if the shift from the allowed range $\Delta V$ is very small. In this way, an intermediate potential generation circuit having further improved driving capacity with low power consumption is achieved.

Of course, by setting the resistance values of the resistors R6, R7, R8 and R9 sufficiently large, the through current between the terminal 11 and ground can be reduced to a sufficiently small value. Thus, the power consumption due to the reference potential generating means 40 can be restricted to a sufficiently small value.

Figure 4:
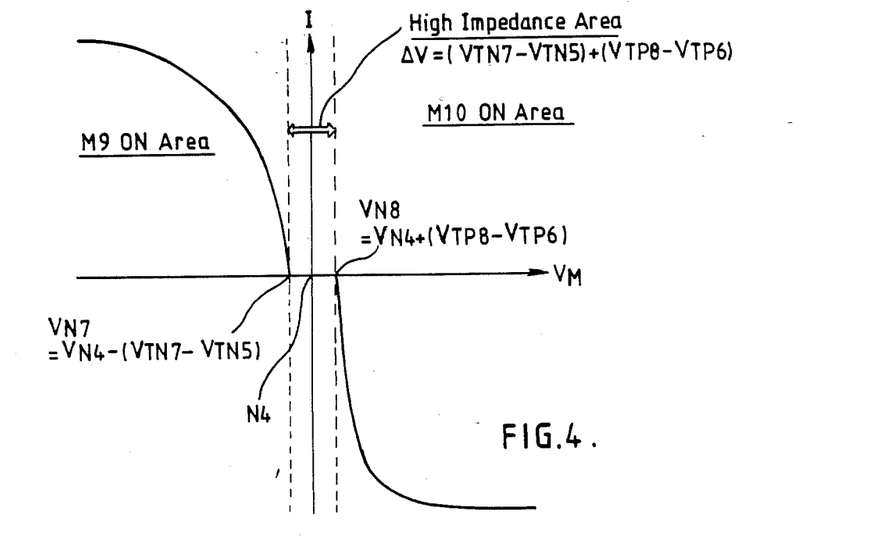
FIG. 4 is a characteristic curve of the embodiment of FIG. 3.

FIG. 4 shows the characteristic of the embodiment of FIG. 3. The gate potential supplied to the MOS transistor M9 or M10, whichever is conductive, is Vcc and sufficiently high, when the intermediate potential VM is out of the allowed range between the first and the second reference potentials VN7 and VN8. Therefore, the current driving capacity, namely the current I, is sufficiently large compared with that of FIG. 2, as shown in FIG. 4.

In other words, even if the intermediate potential VM is only slightly out of the allowed range $\Delta V$, the MOS transistor M9 or M10 is biased with large gate to source voltage. Thus, the intermediate potential VM is rapidly pulled into the allowed high impedance range $\Delta V$ due to the large current driving capacity of the MOS transistors M9 and M10.

Figure 5:
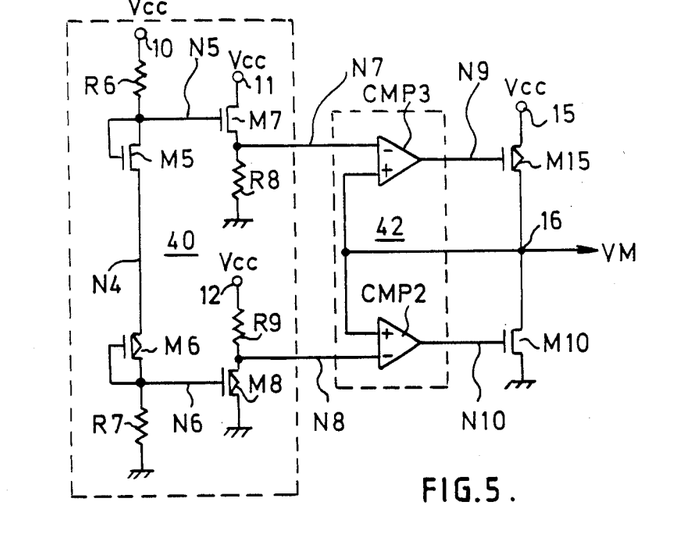
FIGS. 5 to 8 are circuit diagrams of other embodiments of the present invention.

FIG. 5 is a circuit diagram of another embodiment of this invention. In the circuit of FIG. 5, the reference potential generating circuit 40 has the same construction as that of the embodiment of FIG. 3. The difference with respect to the embodiment of FIG. 3 is the construction of the comparing means 42 and the conductivity type of the MOS transistors which supply the output of the comparing means 42. Namely, in this circuit, the conductivity type of the MOS transistor M15 connected between the terminal 15 and the output terminal 16 is P-type, in contrast with that of the transistor M9 which is N-type in FIG. 3.

The comparing means 42 includes comparators CMP2 and CMP3. The inverting input terminal (−) of the comparator CMP3 is connected to the node N7 and receives the first reference potential VN7. The non-inverting input terminal (+) of the comparator CMP3 is connected to an output terminal 16, and receives an intermediate potential VM.

The operation of the circuit of FIG. 5 is as follows. When the intermediate potential VM is lower than the first reference potential, VN7, the comparator CMP3 outputs a potential which is equal to the ground level, namely 0 volt, and makes the P-channel MOS transistor M15 conductive. Thus, the output terminal 16 is raised to the intermediate potential VM. On the contrary, when the intermediate potential VM exceeds the first reference potential VN7, the comparator CMP3 outputs a potential which is equal to the power source potential Vcc and makes the P-channel MOS transistor M15 non-conductive.

When the intermediate potential VM is higher than the second reference potential VN8, the comparator circuit CMP2 outputs a potential which is equal to Vcc and makes the N-channel MOS transistor M10 conductive. Thus, the potential at the output terminal 16 is lowered. On the contrary, when the intermediate potential VM becomes lower than the second reference potential VN8, the comparator CMP2 outputs a potential which is equal to the ground level, namely 0 volt, to make the N-channel MOS transistor M10 non-conductive. In this way, the intermediate potential VM is maintained within the range between the first and the second reference potentials, as shown in FIG. 4.

In this embodiment, the gate potential becomes Vcc or 0 volt to control the conductivity state of the transistor M10 or M15, even if the intermediate potential VM is only slightly out of the allowed range. Thus, the transistors M10 and M15 are controlled with sufficiently large gate to source voltage, and the transistor M15 operates in a non-saturation state with large current driving capacity.

Figure 6:
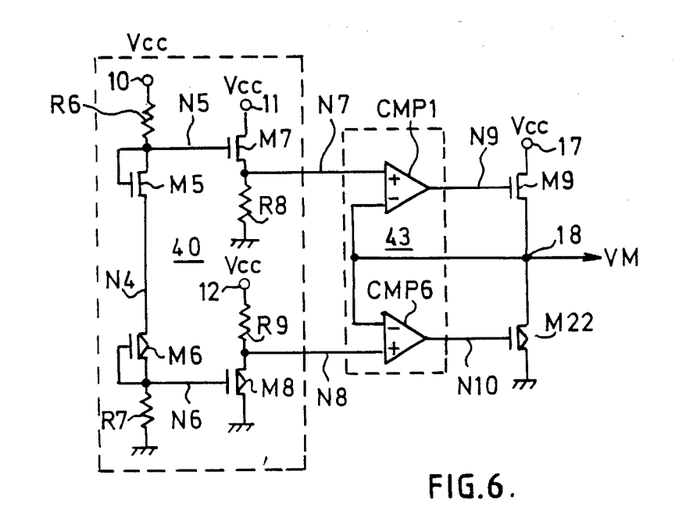

FIG. 6 is a circuit diagram of a further embodiment of the present invention. In this embodiment, the conductivity type of the MOS transistor connected between the output terminal 18 and ground is changed to P-type with respect to the embodiment of FIG. 3. In accordance with the change, the construction of the comparing means 43 is changed.

Namely, the comparing means 43 includes comparators CMP1 and CMP6. The non-inverting input terminal (+) of the comparator CMP6 is connected to the node N8, and receives the second reference potential VN8. The inverting input terminal (−) of the comparator CMP6 is connected to the output terminal 18, and receives the intermediate potential VM.

In this embodiment, when the intermediate potential VM is lower than the first reference potential VN7, the comparator CMP1 outputs a control signal of Vcc level to make the MOS transistor M9 conductive and to raise the intermediate potential VM. When the intermediate potential VM exceeds the first reference potential VN7, the CMP1 outputs a control signal of 0 volt to make the transistor M9 non-conductive and to stop the charging through the transistor M9.

When the intermediate potential VM is higher than the second reference potential VN8, the comparator CMP6 outputs a control signal of 0 volt to make the transistor M22 conductive and to lower the intermediate potential VM. When the intermediate potential VM becomes lower than the second reference potential VN8, CMP6 outputs a control signal at the Vcc level to make the transistor M22 non-conductive. In this way, the intermediate potential VM is maintained within the range determined by the first and the second reference potentials VN7 and VN8.

Figure 7:
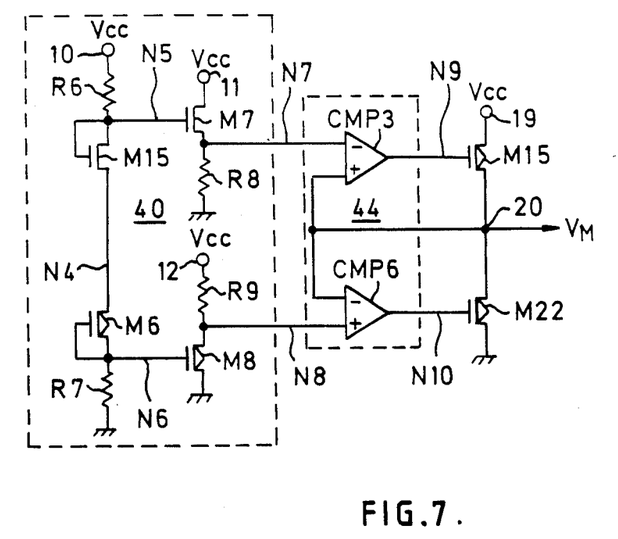

FIG. 7 is a circuit diagram of still further embodiment of the present invention. In this embodiment, the conductivity type of the MOS transistors M15 and M22 is P-type in contrast with the N-type MOS transistors M9 and M10 in the embodiment of FIG. 3. In accordance with the change, the comparing means 44 includes comparators CMP3 and CMP6. The inverting input terminal (−) of the comparator CMP3 is connected to the node N7 and receives the first reference potential VN7. The non-inverting input terminal (+) of the comparator CMP3 is connected to the output terminal 20 and receives the intermediate potential VM. The non-inverting input terminal (+) of the comparator CMP6 is connected to the node N8 and receives the second reference potential VN8. The inverting input terminal (−) of the comparator CMP6 is connected to the output terminal 20 to receive the intermediate potential VM.

The operation is as follows. When the intermediate potential VM is lower than the first reference potential VN7, the comparator CMP3 outputs a control signal of 0 volt to put the P-channel MOS transistor M15 in the conductive state. Then the output terminal 20 is charged to raise the potential VM. When the intermediate potential VM exceeds the first reference potential VN7, the comparator CMP3 outputs a control signal of level Vcc to make the transistor M15 nonconductive.

When the intermediate potential VM is higher than the second reference potential VN8, the comparator CMP6 outputs a control signal at the Vcc level to make the MOS transistor M22 conductive. Thus, the intermediate potential at the output terminal 20 is lowered due to the discharge through the MOS transistor M22. On the contrary, when the intermediate potential VM becomes lower than the second reference potential VN8, the comparator CMP6 outputs a control signal at the Vcc level to make the MOS transistor M22 non-conductive. In this way, the intermediate potential VM is maintained within the range between the first and the second reference potentials VN7 and VN8.

Figure 8:
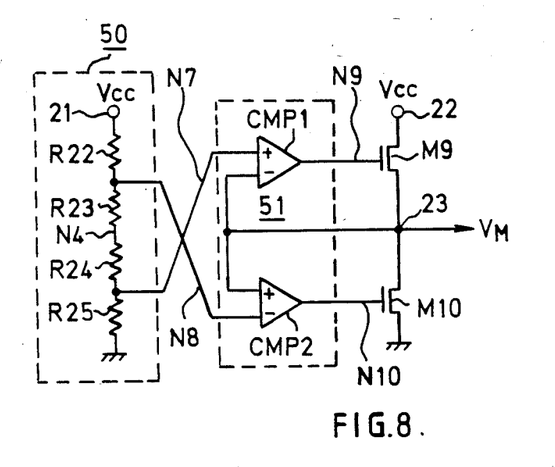

FIG. 8 is a circuit diagram of another embodiment of the present invention. In this embodiment, the reference potential generating means 50 is composed of resistors R22, R23, R24 and R25 which are connected in series between the terminal supplied with the power source potential Vcc and ground. By dividing the power source potential Vcc, first reference potential VN7 which is lower than the second reference potential VN8 is achieved. The operation of this embodiment is the same as that of the embodiment of FIG. 2. Thus, it is omitted.

FIGS. 9(a) to 9(d) are circuit diagrams which are applicable to the comparator in the prescribed embodiments. The comparator of FIG. 9 (a) is a basic construction, and includes N-channel MOS transistors M100 and P-channel MOS transistors M200. The operation of the circuit is omitted as it is well known.

Figure 9:
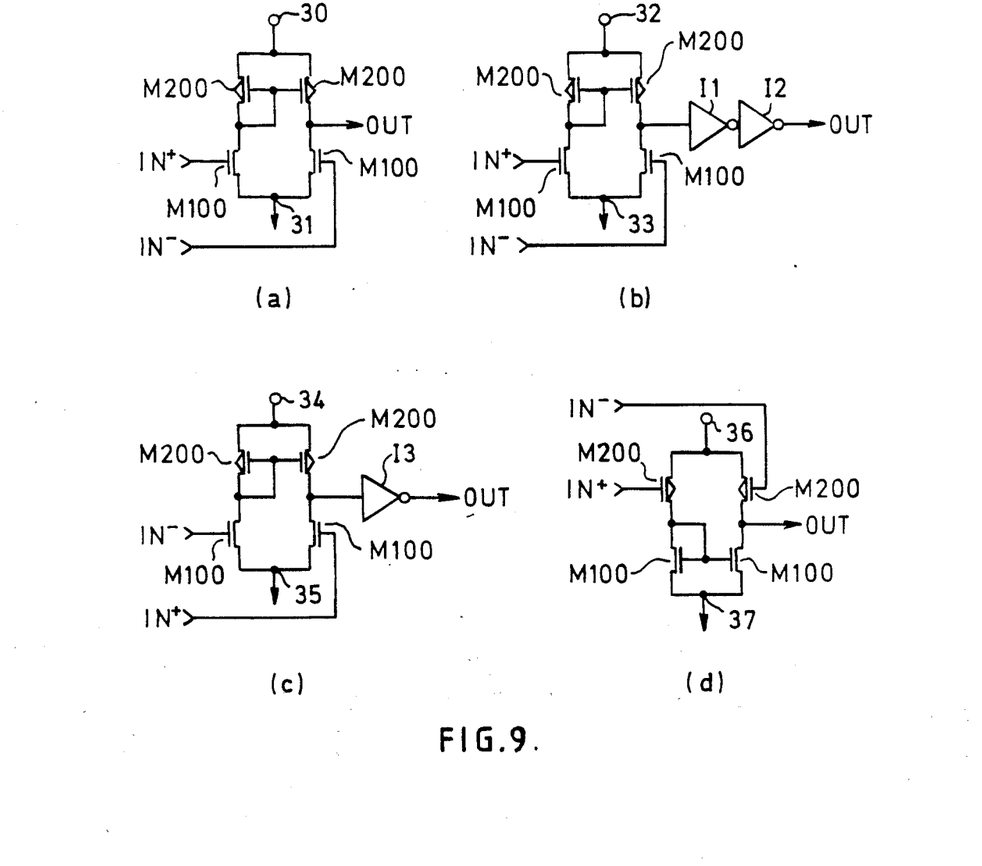
FIGS. 9(a) to 9(d) are circuit diagrams of comparators applicable to the embodiments of the present invention.

In the circuit of FIG. 9 (b), two inverter circuits I1 and I2 are added to increase the driving capacity.

In FIG. 9(c), an inverter circuit I3 is added and the inverting input terminal and the non-inverting input terminal are reversed with respect to the circuit of FIG. 9 (a).

In FIG. 9(d), P-channel MOS transistors M200 are used to receive the input signals, and N-channel MOS transistors M100 are used as loads. Needless to say, some modification by adding the inverter circuits like FIGS. 9 (b) and (c) is possible, similarly.

To reduce power consumption, a MOS transistor controlled by control signal φ (not shown) may be connected between the comparator circuit and the power source terminal to only enable the operation of the comparator circuit.

In the prescribed embodiments, MOS transistors are used to charge or discharge the output terminal. However, it is possible to use bipolar transistors instead of the MOS transistors.

Needless to say, a load MOS transistor which can be considered as a resistor can be used as a resistor in the reference potential generating means in the respective embodiments, as is well known.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An intermediate potential generation circuit for outputting at an output node an intermediate potential intermediate between a first power source potential and a second power source potential, comprising:
   reference potential generating means for generating first and second reference potentials responsive to a first power source potential and a second power source potential, wherein the first reference potential is lower than the second reference potential;
   comparing means responsive to the first reference potential, the second reference potential and the intermediate potential for producing a first control signal when the intermediate potential is lower than the first reference potential, and for producing a second control signal when the intermediate potential is higher than the second reference potential;
   first circuit means having an output connected to said output node and an input responsive to the first control signal for raising the intermediate potential at said output node; and
   second circuit means having an output connected to said output node and an input responsive to the second control signal for lowering the intermediate potential at said output node.

2. The intermediate potential generation circuit of claim 1, wherein the potential difference across the input and output of said first and second output circuit means, respectively, upon production of said first and second control signals, respectively, is the difference between said first and second power source potentially, respectively, and said intermediate potential.

3. The intermediate potential generation circuit of claim 1, wherein the comparing means comprises: first and second comparators, wherein the first comparator outputs the first control signal at a high level in response to the first reference potential having a level higher than that of the intermediate potential, and the second comparator outputs the second control signal at a high level in response to the second reference potential having a level lower than that of the intermediate potential.

4. The intermediate potential generation circuit of claim 1, wherein the first circuit means includes a first P-channel MOS transistor having a gate electrode supplied with the first control signal, a source electrode supplied with the first power source potential and a drain electrode connected to said output node, and the second circuit means includes a second P-channel MOS transistor having a gate electrode supplied with the second control signal, a drain electrode supplied with the second power source potential and a source electrode connected to the output node.

5. The intermediate potential generation circuit according to claim 4, wherein the gate to source potential of the P-channel MOS transistors of said first and second circuit means upon application of said first and second control signals, respectively, to said P-channel MOS transistors is the difference between said first and second power source potentials, respectively, and said intermediate potential.

6. The intermediate potential generation circuit of claim 1, wherein the reference potential generating means comprises:
   a first path between the first power source potential and the second power source potential, including,
      a first resistor having a first end supplied with the first power source potential, and a second end,
      a first MOS transistor of first conductivity type having a gate electrode and a drain electrode connected in common to the other end of the first resistor, and a source electrode,
      a second MOS transistor of a second conductivity type, having a source electrode connected to the source electrode of the first MOS transistor, and a gate electrode and a drain electrode connected in common, and
      a second resistor having a first end connected to the common connection of the gate and the drain electrodes of the second MOS transistor, and a second end supplied with the second power source potential, and
   a second path between the first power source potential and the second power source potential, including,
      a third MOS transistor of first conductivity having a source electrode supplied with the first power source potential, a gate electrode connected to the drain electrode of the first MOS transistor, and a source electrode, and
      a third resistor having a first end connected to the source electrode of the third MOS transistor, and a second end supplied with the second power source potential, and
   a third path between the first power source potential and the second power source potential, including,
      a fourth resistor having a first end supplied with the first power source potential, and a second end, and
      a fourth MOS transistor of second conductivity type having a gate electrode connected to the drain electrode of the second MOS transistor, a source electrode connected to the second end of the fourth resistor and a drain electrode supplied with the second power source potential.

7. The intermediate potential generation circuit of claim 3, wherein the first comparator has a non-inverting input terminal supplied with the first reference potential and an inverting input terminal supplied with the intermediate potential, and the second comparator has an inverting input terminal supplied with the second reference potential, and a non-inverting input terminal supplied with the intermediate potential.

8. The intermediate potential generation circuit of claim 3, wherein the first comparator has an inverting input terminal supplied with the first reference potential and a non-inverting input terminal supplied with the intermediate potential, and the second comparator has an inverting input terminal supplied with the second reference potential and a non-inverting input terminal supplied with the intermediate potential.

9. The intermediate potential generation circuit of claim 3, wherein the first comparator has a non-inverting input terminal supplied with the first reference potential and an inverting input terminal supplied with the intermediate potential, and the second comparator has a non-inverting input terminal supplied with the second reference potential and an inverting input terminal supplied with the intermediate potential.

10. The intermediate potential generation circuit of claim 3, wherein the first comparator has an inverting input terminal supplied with the first reference potential, and a non-inverting input terminal supplied with the intermediate potential, and the second comparator has a non-inverting input terminal supplied with the second reference potential and an inverting input terminal supplied with the intermediate potential.

11. The intermediate potential generation circuit of claim 3, wherein the reference potential generating means includes a plurality of resistors connected in series between the first and second power source potentials.

* * * * *